United States Patent
Ji et al.

(10) Patent No.: US 12,087,380 B2
(45) Date of Patent: Sep. 10, 2024

(54) MEMORY, CHIP, AND METHOD FOR STORING REPAIR INFORMATION OF MEMORY

(71) Applicant: HUAWEI TECHNOLOGIES CO., LTD., GuangDong (CN)

(72) Inventors: Bingwu Ji, Shenzhen (CN); Xingyi Wang, Shenzhen (CN); Yunming Zhou, Shenzhen (CN); Tanfu Zhao, Shenzhen (CN); Chuhua Hu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 219 days.

(21) Appl. No.: 17/894,233

(22) Filed: Aug. 24, 2022

(65) Prior Publication Data

US 2022/0406393 A1 Dec. 22, 2022

Related U.S. Application Data

(63) Continuation of application No. PCT/CN2020/076467, filed on Feb. 24, 2020.

(51) Int. Cl.
  *G11C 29/52* (2006.01)
  *G11C 5/14* (2006.01)
  *G11C 29/02* (2006.01)

(52) U.S. Cl.
  CPC .............. *G11C 29/025* (2013.01); *G11C 5/14* (2013.01); *G11C 29/52* (2013.01)

(58) Field of Classification Search
  CPC ...................................... G11C 29/785
  See application file for complete search history.

(56) References Cited

U.S. PATENT DOCUMENTS

| 5,831,467 A | 11/1998 | Leung et al. |
| 6,452,859 B1 | 9/2002 | Shimano et al. |
| 2005/0132255 A1 | 6/2005 | Tran et al. |
| 2011/0058434 A1* | 3/2011 | Anzou ................ G11C 29/785 365/201 |
| 2014/0119131 A1 | 5/2014 | Verma et al. |

FOREIGN PATENT DOCUMENTS

| CN | 101995905 A | 3/2011 |
| CN | 106356097 A | 1/2017 |
| CN | 109614153 A | 4/2019 |
| CN | 110109708 A | 8/2019 |

* cited by examiner

*Primary Examiner* — Jason Lappas
(74) *Attorney, Agent, or Firm* — Rimon PC

(57) ABSTRACT

This application provides a memory, a chip, and a method for storing repair information of the memory. The memory includes a repair circuit that is configured to receive a first signal from a processor and determine to be powered by a first power supply or a second power supply based on a status of the first signal, to store repair information. The repair information is information of the failed bit cells in the memory. The first power supply is zero or in a high impedance state when a system is powered off, and the second power supply is not zero when the system is powered off. The memory further comprises a processing circuit configured to perform communication between the memory and the processor based on the repair information. Therefore, the repair information of the memory can be stored even during power loss.

16 Claims, 5 Drawing Sheets

MEMORY, CHIP, AND METHOD FOR STORING REPAIR INFORMATION OF MEMORY

CROSS-REFERENCE TO RELATED APPLICATIONS

This application is a continuation of International Application No. PCT/CN2020/076467, filed on Feb. 24, 2020, which is hereby incorporated by reference in its entirety.

TECHNICAL FIELD

This application relates to the field of electronic technologies, and in particular, to a memory, a chip, and a method for storing repair information of a memory.

BACKGROUND

A random access memory (RAM), such as a static random access memory (SRAM) or a dynamic random access memory (DRAM), is an internal memory that directly exchanges data with a processor such as a graphics processing unit (GPU), a central processing unit (CPU), or a digital signal processing (DSP) unit, and is usually used as a temporary data storage medium of an operating system or another running program.

FIG. 1 is a schematic diagram of a structure of a random access memory 2. As shown in FIG. 1, a conventional random access memory 2 may include a controller 20 and a processing module 40. A row or a column in the random access memory 2 may fail due to various reasons such as a manufacturing defect or a mis-operation, and consequently a bit cell of the random access memory 2 has a defect or a problem. In the conventional technology, repair information of the random access memory 2, that is, address information and/or column address information of the failed bit cells, is usually stored in eFuse or another nonvolatile memory through a professional program test (for ease of description, FIG. 1 uses eFuse as an example). Before the random access memory 2 is used, the repair information of the random access memory 2 in eFuse needs to be transferred into the controller 20 bit by bit under clock control. When the random access memory 2 is used, the controller 20 may obtain the repair information of the random access memory 2 from eFuse, so that the processing module 40 does not perform a data read/write operation with the processor using a failed bit cell, ensuring that the random access memory 2 functions normally and the processing module 40 successfully communicates with the processor (shown by using a double-headed arrow in FIG. 1).

In conclusion, it is very important to provide efficient and reliable repair information for the random access memory 2 containing failed bit cells. A chip carrying a processor may supply power to the random access memory 2. When a power supply works normally, the controller 20 can obtain and maintain the repair information of the random access memory 2 from an external device (that is, eFuse or another nonvolatile memory). To implement low power consumption, the chip usually needs to switch between a working mode and a standby mode. In the working mode, the power supply may work normally, and the repair information may be obtained by the random access memory 2. However, in the standby mode, to reduce power consumption, the power supply may be powered off, and the repair information may be lost due to a power-down. After being powered on again, the controller 20 needs to reload the repair information of the random access memory 2. Consequently, the information may be repeatedly loaded when the mode is repeatedly switched. This process is cumbersome and inefficient. For example, in the case of an existing GPU application, especially in the case of an interframe power loss scenario, time consumed for reloading the repair information not only occupies an interframe interval time, but also fails to satisfy some of the interframe protocols or implement an effective power-down.

Therefore, how to store the repair information of the memory is an important problem to be resolved.

SUMMARY

This application provides a memory, a chip, and a method for storing repair information of a memory, to ensure that the repair information of the memory can be continuously stored by the memory, the processor can communicate with the memory successfully by obtaining the repair information of the memory in a timely manner, and the chip can implement effective power-down.

According to a first aspect, this application provides a memory. The memory includes: a repair circuit, configured to receive a first signal from a processor, and determine to be powered by a first power supply or a second power supply based on a status of the first signal, to store repair information. The repair information is information of one or more failed bit cell in the memory, the first power supply is zero or in a high impedance state when the system is powered off, and the second power supply is not zero when the system is powered off; and a processing circuit, configured to perform communication between the memory and the processor based on the repair information.

By using the memory provided in the first aspect, the repair circuit may be connected to the first power supply and the second power supply. The first power supply is zero or in the high impedance state when the system is powered off, and the second power supply is not zero when the system is powered off. The repair circuit may receive the first signal from the processor, and may be powered by the first power supply or the second power supply based on a status of the first signal, to store the repair information. Therefore, this can avoid a case in which the first power supply cannot supply the power. The processing circuit may perform communication between the memory and the processor based on the repair information of the memory. The repair information is address information of the one or more failed bit cells in the memory. In this application, the repair circuit is powered by the first power supply and the second power supply, and the first power supply is powered off as the system is powered off, but the second power supply is not affected when the system is powered off, so that the power may be continuously supplied. Therefore, the repair circuit may switch, based on the indication of the level state of the first signal, between the first power supply and the second power supply, so that the power for obtaining and maintaining the repair information of the memory may be continuously supplied, and the repair information of the memory may be stored. This resolves a problem that the repair information cannot be stored due to a power-down in the conventional technology, so that the processing circuit may accurately obtain the repair information of the memory from the repair circuit in a timely manner, to determine the failed bit cells in the memory, and perform communication between the memory and the processor in the chip. Therefore, this can improve the efficiency and accuracy of performing the data read/write operation between the memory and the processor, and resolve the complexity and inefficiency caused by reloading the repair information in the conventional technology, so that duration of reloading the repair information by the repair circuit is reduced, and even when the system is powered off, the chip may not occupy duration of the data read/write operation because of reloading of the repair information. Therefore, the chip may implement effective powerdown, to successfully perform communication between the processors.

In a possible design, the repair circuit is configured to: when the status of the first signal is a first state, store the repair information using the first power supply; and when the status of the first signal is a second state, store the repair information using the second power supply, where the second state is different from the first state. In this way, the power for obtaining and maintaining the repair information of the memory may be continuously supplied by the first power supply or the second power supply.

In a possible design, the first state is a low level state, and the second state is a high level state; or the first state is a high level state, and the second state is a low level state.

In a possible design, the repair circuit includes: a first circuit and a second circuit that are electrically connected; the second circuit is further electrically connected to the processing circuit; and the first circuit is configured to: receive first information from the processor, and control, based on the status of the first signal, the second circuit to be powered by the first power supply or the second power supply, to store the repair information. In this way, the first circuit may control the second circuit to store the repair information of the memory using the first power supply or the second power supply.

In a possible design, the first circuit is configured to: when the status of the first signal is the first state, control the second circuit to store the repair information using the first power supply. Alternatively, the first circuit is further configured to: when the status of the first signal is the second state, control the second circuit to store the repair information using the second power supply. The second state is different from the first state.

In a possible design, the first circuit includes: M phase inverters, a first PMOS transistor, a first NMOS transistor, a second PMOS transistor, a third PMOS transistor, and a second NMOS transistor; M is a positive integer, and the M phase inverters are connected in series; one end of the M phase inverters connected in series is configured to receive the first signal, and the other end of the M phase inverters connected in series is electrically connected to a gate of the first PMOS transistor and a gate of the first NMOS transistor; a power terminal of each phase inverter and a source of the first PMOS transistor are configured to receive the second power supply; the source of the first PMOS transistor is electrically connected to a substrate electrode; a drain of the first PMOS transistor, a drain of the first NMOS transistor, a gate and a drain of the second NMOS transistor, a gate of the second PMOS transistor, and a gate of the third PMOS transistor are electrically connected; a source of the first NMOS transistor is electrically connected to the substrate electrode; a source of the second PMOS transistor is configured to receive the first power supply; the source of the second PMOS transistor is electrically connected to the substrate electrode, a drain of the second PMOS transistor is electrically connected to a source of the third PMOS transistor, the source of the third PMOS transistor is electrically connected to the substrate electrode, and a drain of the third PMOS transistor and a source of the second NMOS transistor are electrically connected to the second circuit; a ground terminal of each phase inverter, the source of the first NMOS transistor, and a substrate electrode of the second NMOS transistor are all grounded; and a voltage value of the first power supply is less than that of the second power supply.

In this application, regardless of how the level state of the first signal changes, the first circuit may supply the power for obtaining and maintaining the repair information of the memory to the second circuit, and maintain the power at a high voltage level, so that the repair information may not be lost.

In addition, due to the structure of the first circuit, the power supply may be safely switched by using the minimum number of components. In an aspect, because a body diode in the second NMOS transistor is disposed in the first circuit, a path from the first power supply VDDP to the second power supply VDDC is not connected, to prevent voltage backfeed. In another aspect, because there is the first PMOS transistor, the drain of the second NMOS transistor is not directly electrically connected to the second power supply VDDC, to avoid an electro-static discharge (ESD) risk when the drain of the second NMOS transistor is directly connected to the second power supply VDDC.

In a possible design, the first circuit is configured to: when the status of the first signal is the first state, control the second circuit to store the repair information using the first power supply. Alternatively, the first circuit is further configured to: when the status of the first signal is the second state, control the second circuit to store the repair information using the second power supply. The second state is different from the first state.

In a possible design, when the first state is the low level state and the second state is the high level state, M is an odd number; or when the first state is the high level state and the second state is the low level state, M is an even number.

In a possible design, a size of an $m^{th}$ phase inverter is less than that of an $(m+1)^{th}$ phase inverter, m is any integer greater than or equal to 1 and less than M, and m is a positive integer. In this way, driving performance of the M phase inverters is improved, and delay performance of the M phase inverters is reduced, so that the delay performance and the driving performance of the M phase inverters are balanced.

In a possible design, the second circuit is configured to pre-store the repair information. In this way, the repair circuit does not need to obtain the repair information of the memory from another module of the memory, so that the power for obtaining the repair information of the memory is saved.

In a possible design, the second circuit includes N D flip-flops or N JK flip-flops, and N is a positive integer.

In a possible design, the processing circuit is powered by the first power supply and the second power supply. In this way, the repair circuit and the processing circuit may work normally by using power supplied by the first power supply and the second power supply, without adding a new power supply.

According to a second aspect, this application provides a chip. The chip includes: a power supply, a processor, and the memory according to any one of the first aspect or the implementations of the first aspect. The power supply supplies power to the memory through a first power supply and a second power supply. The processor sends a first signal to the memory. The memory performs communication between the memory and the processor based on repair information of the memory.

For beneficial effects of the chip provided in the second aspect and the possible designs of the second aspect, refer to the beneficial effects brought by the first aspect and the possible implementations of the first aspect. Details are not described herein again.

According to a third aspect, this application provides a method for storing repair information of a memory, and the method is applied to the memory. The memory includes a repair circuit and a processing circuit; and the processing circuit is configured to perform communication between the memory and a processor based on the repair information.

The method includes: The repair circuit receives a first signal from the processor, and determines to be powered by a first power supply or a second power supply based on a status of the first signal, to store the repair information. The repair information is information of the one or more failed bit cells in the memory, the first power supply is zero or in a high impedance state when a system is powered off, and the second power supply is not zero when the system is powered off.

According to the method for storing repair information of a memory provided in the third aspect, the repair circuit may be connected to the first power supply and the second power supply. The first power supply is zero or in the high impedance state when the system is powered off, and the second power supply is not zero when the system is powered off. The repair circuit may receive the first signal from the processor, and may be powered by the first power supply or the second power supply based on the status of the first signal, to store the repair information. Therefore, this can avoid a case in which the first power supply cannot supply the power. The processing circuit may perform communication between the memory and the processor based on the repair information of the memory. The repair information is information of the failed bit cells in the memory. In this application, the repair circuit is powered by the first power supply and the second power supply, and the first power supply is powered off as the system is powered off, but the second power supply is not affected when the system is powered off, so that the power may be continuously supplied. Therefore, the repair circuit may switch, based on the indication of the level state of the first signal, between the first power supply and the second power supply, so that the power for obtaining and maintaining the repair information of the memory may be continuously supplied, and the repair information of the memory may be stored. This resolves a problem that the repair information cannot be stored due to a power-down in the conventional technology, so that the processing circuit may accurately obtain the repair information of the memory from the repair circuit in a timely manner, to determine the failed bit cells in the memory, and perform communication between the memory and the processor in the chip. Therefore, this can improve the efficiency and accuracy of performing the data read/write operation between the memory and the processor, and resolve the complexity and inefficiency caused by reloading the repair information in the conventional technology, so that duration of reloading the repair information by the repair circuit is reduced, and even when the system is powered off, the chip may not occupy duration of the data read/write operation because of reloading of the repair information. Therefore, the chip may implement effective power-down, to successfully perform communication between the processor and the processor.

In a possible design, that the repair circuit determines to be powered by a first power supply or a second power supply based on a status of the first signal, to store the repair information includes: When the status of the first signal is a first state, the repair circuit stores the repair information using the first power supply. Alternatively, when the status of the first signal is a second state, the repair circuit may store the repair information using the second power supply. The second state is different from the first state.

In a possible design, the first state is a low level state, and the second state is a high level state; or the first state is a high level state, and the second state is a low level state.

In a possible design, the repair information is information pre-stored in the repair circuit. In this way, high level of the repair circuit for obtaining the repair information is saved, so that high level consumption is reduced.

DESCRIPTION OF REFERENCE NUMERALS

2—random access memory; 20—controller; 40—processing module;
1—memory; 10—repair circuit; 11—first circuit; 12—second circuit;
30—processing circuit; 100—chip; 3—power supply; 5—processor.

DESCRIPTION OF EMBODIMENTS

In this application, at least one means one or more, and a plurality of means two or more. And/or describes an association relationship between associated objects, and represents that three relationships may exist. For example, A and/or B may represent the following cases: Only A exists, both A and B exist, and only B exists, where A and B may be singular or plural. The character "I" generally indicates an "or" relationship between the associated objects. At least one of the following items (pieces) or a similar expression thereof indicates any combination of these items, including a single item (piece) or any combination of a plurality of items (pieces). For example, at least one of a, b, or c may represent: a, b, c, a combination of a and b, a combination of a and c, a combination of b and c, or a combination of a, b and c, where each of a, b, and c may be in a singular form or a plural form. In addition, terms "first" and "second" are merely used for a purpose of description, and shall not be understood as an indication or implication of relative importance.

This application provides a memory, a chip, and a method for storing repair information of a memory. Based on an indication of a level state of the first signal, power for obtaining and maintaining the repair information of the memory may be obtained through the first power supply and the second power supply. This resolves a problem that the repair information cannot be stored due to a power-down in the conventional technology, so that the repair circuit in the memory can store the repair information of the memory, and the processing circuit can obtain the repair information of the memory from the repair circuit in a timely manner, to perform communication between the memory and the processor in the chip. Therefore, this can improve the efficiency and accuracy of performing a data read/write operation between the memory and the processor in the chip, and reduce the complexity and inefficiency caused by reloading the repair information in the conventional technology, so that duration of reloading the repair information by the repair circuit is reduced, and even if the system is powered off, the chip may not occupy duration of the data read/write operation because of reloading of the repair information. Therefore, the chip may implement effective power-down, to successfully perform communication between the processor and the processor.

Figure 2:
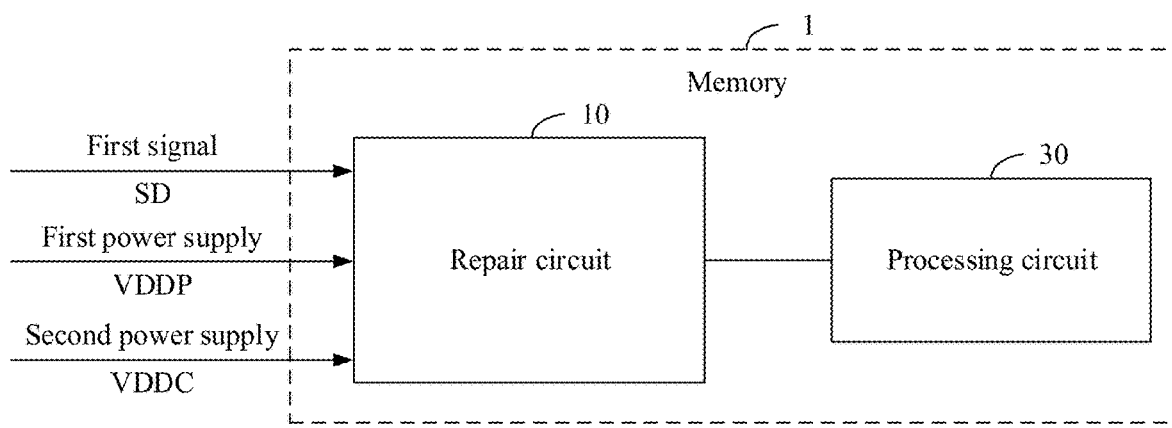
FIG. 2 is a schematic diagram of a structure of a memory according to an embodiment of this application.

The following describes in detail a specific structure of the memory in this application with reference to FIG. 2.

FIG. 2 is a schematic diagram of a structure of a memory according to an embodiment of this application. As shown in FIG. 2, a memory 1 in this application may include a repair circuit 10 and a processing circuit 30 that are electrically connected.

The memory 1 in this application may include but is not limited to a random access memory (RAM) such as an SRAM or a DRAM.

In this application, the repair circuit 10 may be connected to a first power supply (FIG. 2 uses VDDP as an example). The repair circuit 10 may be directly powered by the first power supply by using a power supply (not shown in FIG. 2) in a chip. Alternatively, the repair circuit 10 may be powered by the power supply in the chip by using a component such as a voltage divider. This is not limited in this application. In addition, for a specific implementation of the power supply, refer to the following description. Details are not described herein again.

In addition, the first power supply may be zero or in a high impedance state when a system is powered off. In this application, the system being powered off may be understood as the power supply in the chip being powered off. For example, to reduce power consumption in a standby mode, the power supply in the chip is down, that is, the system is powered off.

In other words, the first power supply may be powered off as the system is powered off.

To be specific, the first power supply may be powered off to a voltage of 0 V or a voltage close to 0 V as the system is powered off. As a result, the repair circuit 10 cannot obtain, through the first power supply, the power for storing repair information of the memory 1.

Alternatively, the first power supply is in the high impedance state as the system is powered off. In this case, the first power supply cannot be connected to the repair circuit 10. As a result, the repair circuit 10 cannot obtain, through the first power supply, the power for storing the repair information of the memory 1. The high impedance state herein may be understood as that impedance between the power supply in the chip and the repair circuit 10 is very high, and the power supply in the chip cannot supply the power to the repair circuit 10 through the first power supply.

The repair information of the memory 1 is information of the failed bit cells in the memory, for example, address information and/or column address information of the failed bit cells. A specific representation of the repair information is not limited in this application.

In addition, the repair information of the memory 1 may be pre-stored in the repair circuit 10, or may be obtained by the repair circuit 10 from another module of the memory 1. This is not limited in this application. When the repair information of the memory 1 is not pre-stored in the repair circuit 10, the repair circuit 10 may obtain the repair information of the memory 1 from the other module of the memory 1. When the repair information of the memory 1 is pre-stored in the repair circuit 10, the first power supply or a second power supply may supply power for maintaining the repair information of the memory 1 to the repair circuit 10. Therefore, the power for obtaining the repair information is saved, and supply and consumption of the power are saved.

In this application, the repair circuit 10 may be connected to the second power supply (FIG. 2 uses VDDC as an example). The repair circuit 10 may be directly powered by the second power supply by using a power module in the chip. Alternatively, the repair circuit 10 may be powered by the power module in the chip by using the component such as the voltage divider. This is not limited in this application.

In addition, the second power supply may not be zero when the system is powered off. In other words, the second power supply is not powered off as the system is powered off. As a result, the repair circuit 10 can obtain, through the second power supply, the high level for storing the repair information of the memory 1, and the repair circuit 10 can store the repair information of the memory 1. Generally, the second power supply may be maintained at a high voltage level.

The first power supply and the second power supply may be powered by a same power supply, or may be powered by different power supplies. This is not limited in this application. In addition, for the specific implementation of the power supply, refer to the following description. Details are not described herein again.

In conclusion, the first power supply may be affected or cannot continuously supply the power to the repair circuit 10 when the system is powered off (that is, the power supply in the chip is down), but the second power supply may not be affected and may continuously supply the power to the repair circuit 10 when the system is powered off. In addition, a voltage of the first power supply may be equal to or not equal to the voltage of a second power supply. This is not limited in this application.

A person skilled in the art may understand that the repair circuit 10 may consume power to obtain and maintain the repair information of the memory 1, to store the repair information of the memory 1. Based on the foregoing description, in an entire process of supplying the power for obtaining and maintaining the repair information of the memory 1 by the repair circuit 10, because when the system is powered off, the first power supply may not supply the power but the second power supply may continuously supply the power, the second power supply may not be affected when the system is powered off, and the processor in the chip may usually detect that the system is powered off. Therefore, in this application, a processor (not shown in FIG. 2) in the chip may indicate a power supply status of the first power supply based on a status of the first signal, for example, whether the first power supply can supply the power, whether the first power supply is powered off, or the first power supply does not need to supply the power.

A first signal may be a digital signal or an analog signal. The first signal may be directly sent by the processor in the chip to the repair circuit 10, or may be indirectly sent by the processor in the chip to the repair circuit 10 by using a component such as a register. This is not limited in this application. In addition, for a specific implementation of the processor, refer to the following description. Details are not described herein again.

In this application, the repair circuit 10 may receive the first signal from the processor (FIG. 2 uses an SD as an example), so that the repair circuit 10 can avoid, based on first information, that the first power supply is zero or in the high impedance state when the system is powered off. Therefore, the power for obtaining and maintaining the repair information of the memory 1 may be continuously supplied to the repair circuit 10 by the first power supply or the second power supply.

When a status of the first information indicates that the power may be supplied by the first power supply, the repair circuit 10 may be powered by the first power supply or the second power supply, to store the repair information of the memory 1. To reduce power consumption, the repair circuit 10 may be powered by the first power supply. When the status of the first signal indicates that the power may not be supplied by the first power supply, for example, the first power supply is powered off and the power does not need to be supplied by the first power supply (for example, the first power supply is used for other purposes), or the like, the repair circuit 10 may be powered by the second power supply, to store the repair information of the memory 1.

A specific status of the first information is not limited in this application. Optionally, when the status of the first signal is a first state, the repair circuit 10 may determine to be currently powered by the first power supply based on the first state. For example, if the first power supply is not powered off, the power may be supplied by the first power supply or the second power supply, to store the repair information. To reduce the power consumption, the repair circuit 10 may be powered by the first power supply. When the level state of the first signal is a second state, the repair circuit 10 may determine to be currently powered by the first power supply based on the second state. For example, if the first power supply is powered off or the power does not need to be currently powered by the first power supply, the power may be supplied by the second power supply, to store the repair information.

The second state is different from the first state. A specific implementation of the first state and the second state are not limited in this application. Optionally, the first state is in a low level state, and the second state is a high level state. Alternatively, the first state is a high level state, and the second state is a low level state.

In this application, the memory 1 further includes the processing circuit 30. The processing circuit 30 is a core circuit of the memory 1. A specific implementation of the processing circuit 30 is not limited in this application. For example, the processing circuit 30 may include four parts: an input/output module, a mode selection module, a read/write control module, and a storage array module. The input/output module is mainly configured to exchange data between the memory 1 and the processor in the chip and transmit the data between the processing circuit 30 and the repair circuit 10. The mode selection module is mainly configured to verify, commission, and control the processing circuit 30. The read/write control module is mainly configured to perform a data read/write operation with the processor in the chip of the memory 1. The storage array module mainly includes a plurality of bit cells that are controlled by a word line address and a bit line address, and is configured to store a data array.

In this application, to determine whether repair information stored in the repair circuit 10 is invalid, the processing circuit 30 may obtain, by using a module such as a software program, the address information of the failed bit cells in the memory 1 and address information of a readable and writable bit cell in the memory 1, and the processing circuit 30 may further obtain, from the repair circuit 10, the repair information stored in the repair circuit 10.

In this way, the processing circuit 30 may match, bit by bit, whether the address information of the failed bit cells in the memory 1 is consistent with the repair information stored in the repair circuit 10. When determining that the address information of the failed bit cells in the memory 1 is consistent with the repair information, the processing circuit 30 may replace the repair information stored in the repair circuit 10 with the address information of the readable and writable bit cell in the memory 1. When determining that the address information of the failed bit cells in the memory 1 is inconsistent with the repair information, the processing circuit 30 does not need to replace the repair information stored in the repair circuit 10.

Therefore, based on an electrical connection between the processing circuit 30 and the processor in the chip, the processing circuit 30 performs, based on the address information of the readable and writable bit cell in the memory 1, communication between the memory 1 and the processor in the chip by the data read/write operation.

Figure 1:
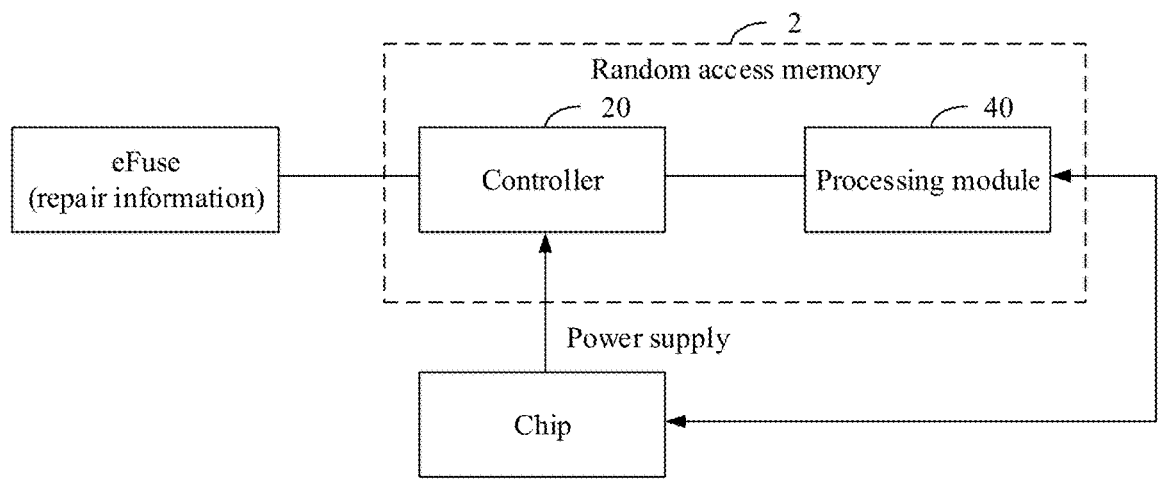
FIG. 1 is a schematic diagram of a structure of a random access memory.

In FIG. 1, a conventional random access memory 2 cannot continuously store repair information of the random access memory 2 when the power supply in the chip is down. However, in this application, the power for obtaining and maintaining the repair information of the memory 1 by the repair circuit 10 may be continuously supplied by the first power supply or the second power supply based on an indication of the status of the first signal, to avoid that the power cannot be supplied by the first power supply, so that the repair circuit 10 can store the repair information of the memory 1. This helps the processing circuit 30 obtain the repair information of the memory 1 from the repair circuit 10 in a timely manner, so that the processing circuit 30 can accurately determine the failed bit cells in the memory 1. Therefore, efficiency and accuracy of the data read/write operation between the memory 1 and the processor in the chip are improved.

In addition, the conventional random access memory 2 needs to reload the repair information before the memory 1 is used. As a result, the process is complex and its efficiency is low. In this application, the repair circuit 10 does not need to reload the repair information of the memory because the power can be continuously supplied by the first power supply or the second power supply, so that duration of reloading the repair information by the repair circuit 10 is reduced, and even if the system is powered off, the chip may not occupy duration of the data read/write operation because of reloading of the repair information. Therefore, the chip may implement effective power-down, to successfully perform communication between the processor and the processor.

The memory provided in this application may be connected to the first power supply and the second power supply by using a repair circuit. The first power supply is zero or in the high impedance state when the system is powered off, and the second power supply is not zero when the system is powered off. The repair circuit may receive the first signal from the processor, and may be powered by the first power supply or the second power supply based on a status of the first signal, to store the repair information. Therefore, this can avoid a case in which the first power supply cannot supply the power. The processing circuit may perform communication between the memory and the processor based on the repair information of the memory. The repair information is information of the failed bit cells in the memory. In this application, the repair circuit is powered by the first power supply and the second power supply, and the first power supply is powered off as the system is powered off, but the second power supply is not affected when the system is powered off, so that the power may be continuously supplied. Therefore, the repair circuit may switch, based on the indication of the level state of the first signal, between the first power supply and the second power supply, so that the power for obtaining and maintaining the repair information of the memory may be continuously supplied, and the repair information of the memory may be stored. This resolves a problem that the repair information cannot be stored due to a power-down in the conventional technology, so that the processing circuit may accurately obtain the repair information of the memory from the repair circuit in a timely manner, to determine the failed bit cells in the memory, and perform communication between the memory and the processor in the chip. Therefore, this can improve the efficiency and accuracy of performing the data read/write operation between the memory and the processor, and reduce the complexity and inefficiency caused by reloading the repair information in the conventional technology. Duration of reloading the repair information by the repair circuit is reduced, and even when the system is powered off, the chip may not occupy duration of the data read/write operation because of reloading of the repair information. Therefore, the chip may implement effective power-down, to successfully perform communication between the processor and the processor.

The following uses a specific implementation structure of the memory 1 in this application as an example with reference to a specific embodiment.

Figure 3:
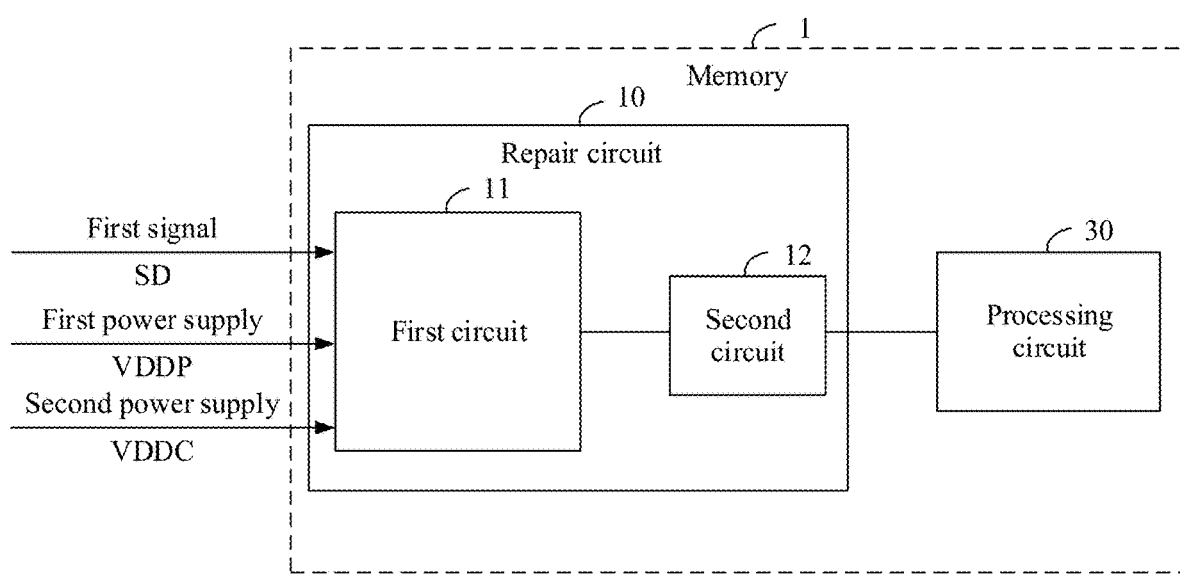
FIG. 3 is a schematic diagram of a structure of a memory according to an embodiment of this application.

In this application, the repair circuit 10 may be implemented in a plurality of forms. Based on functions of the repair circuit 10, optionally based on the embodiment shown in FIG. 2, as shown in FIG. 3, the repair circuit 10 in this application may include a first circuit 11 and a second circuit 12 that are electrically connected. The second circuit 12 is further electrically connected to the processing circuit 30.

The first circuit 11 is configured to connect the first power supply and the second power supply, and receive the first signal from the processor. The second circuit 12 is configured to store or save the repair information. Specific implementations of the first circuit 11 and the second circuit 12 are not limited in this application.

It should be noted that the second circuit 12 may pre-store the repair information, or may store the repair information through transmission of the first circuit 11. This is not limited in this application. When the second circuit 12 does not pre-store the repair information of the memory 1, the first circuit 11 may obtain the repair information of the memory 1 from another module of the memory 1. When the second circuit 12 pre-stores the repair information of the memory 1, the first circuit 11 does not need to obtain the repair information of the memory 1 from another module of the memory 1, and only needs to supply the power for storing the repair information of the memory 1 to the second circuit 12. Therefore, the power for obtaining the repair information of the memory 1 may be saved.

In conclusion, based on the electrical connection between the first circuit 11 and the second circuit 12, to obtain and maintain the repair information of the memory 1, the first circuit 11 may control, based on the status of the first signal, the second circuit 12 to be powered by the first power supply or the second power supply, to store the repair information of the memory 1. Therefore, based on the electrical connection between the second circuit 12 and the processing circuit 30, the processing circuit 30 may obtain the repair information of the memory 1 from the second circuit 12, to perform communication between the memory 1 and the processor.

Optionally, when the status of the first signal is the first state, the first circuit 11 may control the second circuit 12 to be powered by the first power supply or the second power supply, to store the repair information. To reduce the power consumption, the first circuit 11 may be powered by the first power supply. When the level state of the first signal is the second state, the first circuit 11 may control the second circuit 12 to be powered by the second power supply, to store the repair information.

In this application, the first circuit 11 has a plurality of implementations. Based on the embodiment shown in FIG. 3, the following uses a specific structure of the first circuit 11 in this application as an example with reference to FIG. 4.

Figure 4:
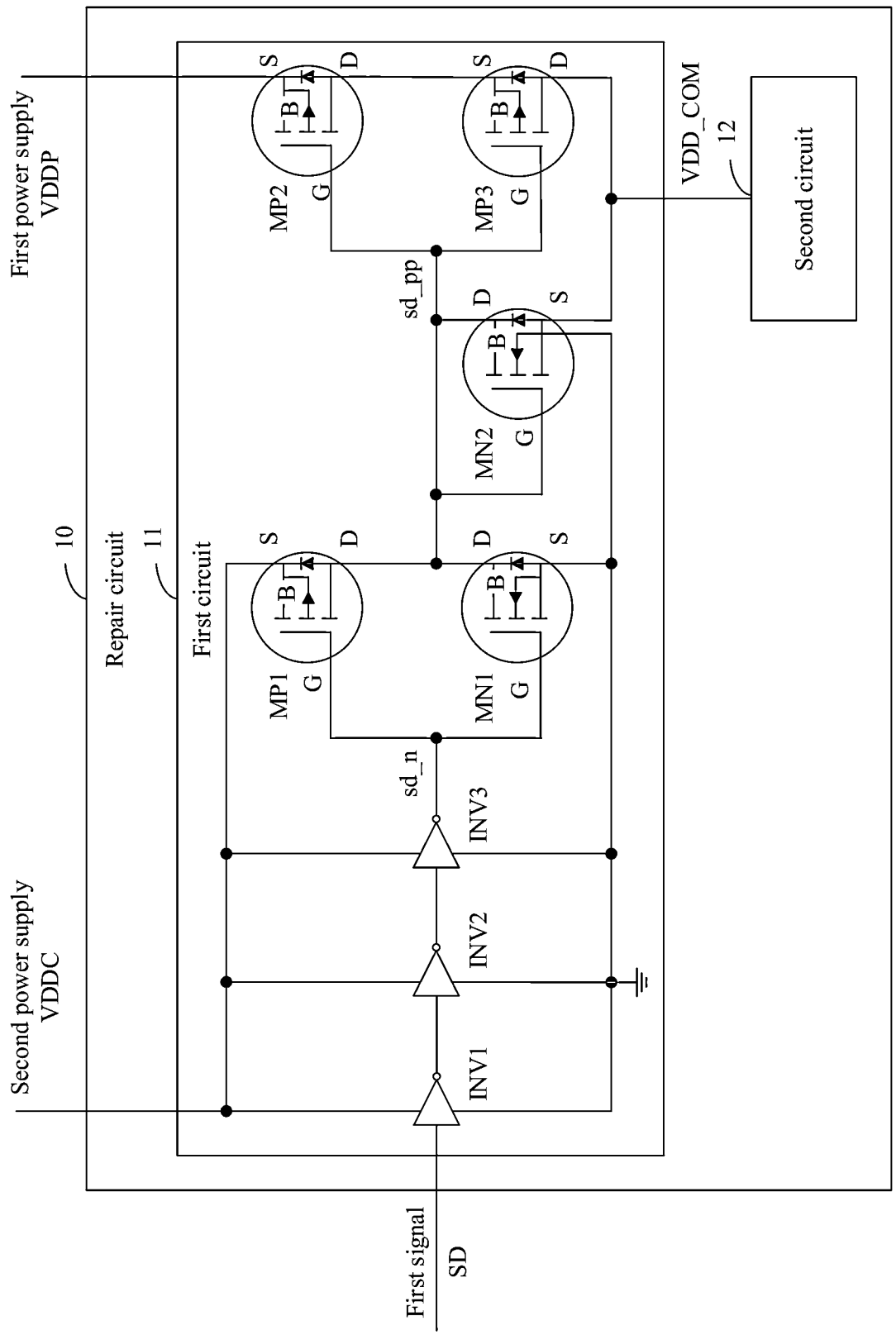
FIG. 4 is a schematic diagram of a first circuit in a repair circuit according to an embodiment of this application.

In a feasible implementation, as shown in FIG. 4, the first circuit 11 in this application may include M phase inverters, a first PMOS transistor, a first NMOS transistor, a second PMOS transistor, a third PMOS transistor, and a second NMOS transistor. A field effect (metal oxide semiconductor (MOS)) transistor includes a P-type metal-oxide-semiconductor (PMOS) transistor and an N-type metal-oxide-semiconductor (NMOS) transistor.

For ease of description, FIG. 4 uses an example in which the first PMOS transistor is indicated by MP1, the first NMOS transistor is indicated by MN1, the second PMOS transistor is indicated by MP2, the third PMOS transistor is indicated by MP3, and the second NMOS transistor is indicated by MN2.

In this application, the M phase inverters are connected in series. One end of the M phase inverters connected in series is configured to receive the first signal, and the other end of the M phase inverters connected in series is electrically connected to a gate of the first PMOS transistor and a gate of the first NMOS transistor. A power terminal of each phase inverter and a source of the first PMOS transistor are configured to receive the second power supply. The source of the first PMOS transistor is electrically connected to a substrate electrode. A drain of the first PMOS transistor, a drain of the first NMOS transistor, a gate and a drain of the second NMOS transistor, a gate of the second PMOS transistor, and a gate of the third PMOS transistor are electrically connected. A source of the first NMOS transistor is electrically connected to the substrate electrode, and a source of the second PMOS transistor is configured to receive the first power supply. The source of the second PMOS transistor is electrically connected to the substrate electrode, a drain of the second PMOS transistor is electrically connected to a source of the third PMOS transistor, the source of the third PMOS transistor is electrically connected to the substrate electrode, and a drain of the third PMOS transistor and a source of the second NMOS transistor are electrically connected to the second circuit 12. A ground terminal of each phase inverter, the source of the first NMOS transistor, and a substrate electrode of the second NMOS transistor are all grounded.

M is a positive integer, and a specific value of M is not limited in this application. Based on the connections, when the first state is the low level state and the second state is the high level state, M is an odd number, for example, M is 3.

When the first state is the high level state and the second state is the low level state, M is an even number, for example, M is 4.

In this application, the first PMOS transistor, the first NMOS transistor, the second PMOS transistor, the third PMOS transistor, and the second NMOS transistor have a large size, so that losses of voltages consumed by the first PMOS transistor, the first NMOS transistor, the second PMOS transistor, the third PMOS transistor, and the second NMOS transistor are reduced, to ensure that sufficient power can be supplied to the second circuit 12.

In addition, in addition to that the second PMOS transistor is connected in series to the third PMOS transistor, in the first circuit 11 in this application, three or more PMOS transistors may be connected in series. Generally, in consideration of complexity of implementing a circuit layout, in the first circuit 11, the third PMOS transistor is usually connected in series to the second PMOS transistor, so that the layout is simple and easy to design, and layout space is further saved.

For ease of description, FIG. 4 shows a specific structure of the first circuit 11 by using an example in which the first state is the low level state, the second state is the high level state, M is 3, and the three phase inverters are respectively INV1, INV2, and INV3. Further, a working process of the first circuit 11 and the second circuit 12 is:

When the status of the first signal is the first state (that is, the low level state), the second power supply VDDC supplies the power to the three phase inverters (INV1, INV2, and INV3) and the first PMOS transistor MP1, a voltage at a junction sd_n (that is, a voltage at an output terminal of the phase inverter INV3, or voltages at gates of the first PMOS transistor MP1 and the first NMOS transistor MN1) are equal to that of the second power supply VDDC, the first PMOS transistor MP1 is cut off, and the first NMOS transistor MN1 is conducted, a voltage of a junction sd_pp (that is, voltages of drains of the first PMOS transistor MP1 and the first NMOS transistor MN1, or voltages of gates of the second PMOS transistor MP2 and the third PMOS transistor MP3) are equal to a ground voltage VSS.

When the first power supply VDDP supplies the power to the second PMOS transistor, the second PMOS transistor MP2 and the third PMOS transistor MP3 are conducted. Therefore, the first power supply VDDP inputs a voltage VDD_COM to the second circuit 12 through the second PMOS transistor MP2 and the third PMOS transistor MP3.

The second PMOS transistor MP2 and the third PMOS transistor MP3 have a large size, and current consumption of the second circuit 12 is low, so that the voltage VDD_COM is close to that of the first power supply VDDP, to be specific, the first power supply VDDP supplies the power to the second circuit 12.

When the status of the first signal is the second state (that is, the high level), the second power supply VDDC supplies the power to the three phase inverters (INV1, INV2, and INV3) and the first PMOS transistor MP1, the voltage at the junction sd_n (that is, the voltage at the output terminal of the phase inverter INV3, or the voltages at the gates of the first PMOS transistor MP1 and the first NMOS transistor MN1) are equal to the ground voltage VSS, the first PMOS transistor MP1 is conducted, and the first NMOS transistor MN1 is cut off, the voltage at the junction sd_pp (that is, the voltages at the drains of the first PMOS transistor MP1 and the first NMOS transistor MN1, or the voltages at the gates of the second PMOS transistor MP2 and the third PMOS transistor MP3) are equal to that of the second power supply VDDC.

The first power supply VDDP supplies the power to the second PMOS transistor. Because a voltage value of the first power supply VDDP is less than that of the second power supply VDDC (that is, VDDP<VDDC), the second PMOS transistor MP2 and the third PMOS transistor MP3 are cut off. Based on a connection between the second PMOS transistor MP2 and the third PMOS transistor MP3, a body diode in the second PMOS transistor MP2 is connected in series to a body diode in the third PMOS transistor MP3, so that a path from the voltage VDD_COM in the second circuit 12 to the first power supply VDDP may not be conducted, to prevent the voltage backfeed.

Because the voltage at the junction sd_n is equal to the ground voltage VSS, the second NMOS transistor MN2 is conducted. In addition, a gate G and a drain D of the second NMOS transistor MN2 are connected together, and a substrate electrode B (body) of the second NMOS transistor MN2 is directly connected to the ground voltage VSS, so that substrate electrode bias effect of the second NMOS transistor MN2 is weak. Therefore, a threshold voltage $V_{th, MMN2}$ of the second NMOS transistor MN2 basically remains unchanged. Therefore, when the voltage VDD_COM decreases and is less than a difference between the threshold voltages $V_{th, MMN2}$ of the second power supply VDDC and the second NMOS transistor MN2 (that is, VDD_COM<VDDC-$V_{th, MMN2}$) due to internal power consumption of the second circuit 12, the second NMOS transistor MN2 is conducted, so that the voltage VDD_COM is close to the difference (that is, VDDC-$V_{th, MMN2}$) between the threshold voltages $V_{th, MMN2}$ of the second power supply VDDC and the second NMOS transistor MN2, to be specific, the second circuit 12 is powered by the second power supply VDDC. Because the second power supply VDDC can continuously supply the power, the repair information of the memory 1 may be stored in the second circuit 12. Therefore, the second power supply VDDC inputs the voltage VDD_COM to the second circuit 12 through the first PMOS transistor MP1 and the second NMOS transistor MN2.

In conclusion, regardless of how the status of the first signal changes, the first circuit 11 may supply the power for obtaining and maintaining the repair information of the memory 1 to the second circuit 12, and maintain the power at the high voltage level, so that the repair information may not be lost.

In addition, due to the structure of the first circuit 11, the power supply may be safely switched by using the minimum number of components. In an aspect, because the body diode in the second NMOS transistor is disposed in the first circuit 11, a path from the first power supply VDDP to the second power supply VDDC is not connected, to prevent the voltage backfeed. In another aspect, because there is the first PMOS transistor MP1, the drain of the second NMOS transistor MN2 is not directly electrically connected to the second power supply VDDC, to avoid an electro-static discharge (ESD) risk when the drain of the second NMOS transistor is directly connected to the second power supply VDDC.

In consideration of delay performance and driving performance of the phase inverter, optionally, a size of an $m^{th}$ phase inverter is less than that of an $(m+1)^{th}$ phase inverter, where m is any integer greater than or equal to 1 and less than M, and m is a positive integer. In other words, the sizes of the M phase inverters may be increased stage by stage, to be specific, driving performance of the M phase inverters is improved, and delay performance of the M phase inverters is reduced, so that the delay performance and the driving performance of the M phase inverters are balanced.

In this application, the second circuit 12 may include a multistage register that may be implemented in a plurality of forms. Optionally, the second circuit 12 may include N D flip-flops or N JK flip-flops, and N is a positive integer. N is determined by the number of bits in the word line address and the number of bits in the bit line address of the memory 1. Based on the embodiment shown in FIG. 3 or FIG. 4, the following uses a specific structure of the second circuit 12 in this application as an example with reference to FIG. 5. For ease of description, FIG. 5 uses the N D flip-flops in the second circuit 12 as an example.

Figure 5:
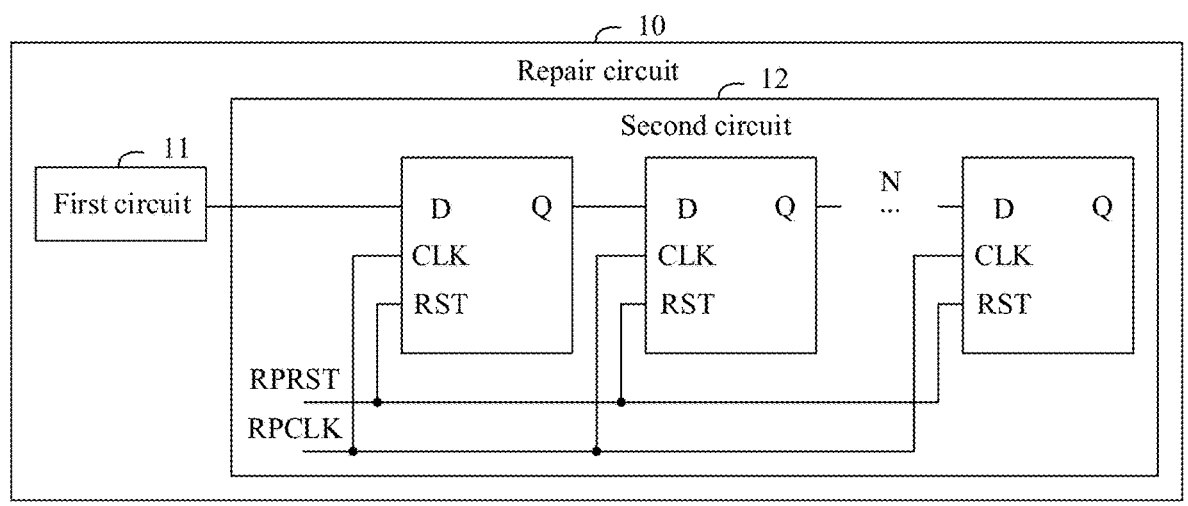
FIG. 5 is a schematic diagram of a second circuit in a repair circuit according to an embodiment of this application.

As shown in FIG. 5, a Q end of an $n^{th}$ D flip-flop in the second circuit 12 is electrically connected to a D end of an $(n+1)^{th}$ D flip-flop, where n is any integer greater than or equal to 1 and less than N, and n is a positive integer. In addition, a D end of the first D flip-flop in the second circuit 12 is electrically connected to the first circuit 11, and is configured to receive the repair information of the memory 1.

RST reset ends of all D flip-flop are electrically connected together to form an RPRST reset end of the second circuit 12. In addition, the processor in the chip is electrically connected to the RPRST reset end (not shown in FIG. 5) of the second circuit 12, and is configured to transmit a reset signal, so that each D flip-flop is reset to an initial status based on the reset signal. CLK clock ends of all D flip-flops are electrically connected together to form an RPCLK clock end of the second circuit 12. In addition, the processor in the chip is electrically connected to the RPCLK clock end (not shown in FIG. 5) of the second circuit 12, and is configured to transmit a clock cycle signal.

Before the repair information of the memory 1 is written into the N D flip-flops, the N D flip-flops are reset to an initial status based on the RPRST reset end of the second circuit 12. Under control of the RPCLK clock end of the second circuit 12, one bit of address information in the repair information may be written into each D flip-flop in a corresponding clock cycle. Therefore, the second circuit 12 completes a process of storing the repair information.

In this application, when the status of the first signal is the first state, the first power supply VDDP supplies the power to the N D flip-flops. When the status of the first signal is the second state, the N D flip-flops may be powered by the second power supply VDDC switched from the first power supply VDDP.

In addition, because the processing circuit 30 may implement the data read/write operation between the memory 1 and the processor, the power of the memory 1 is mainly supplied by the processing circuit 30, and little power is supplied by the repair circuit 10. The power required by the processing circuit 30 derives from storage of the data array, and little power derives from the data read/write operation. Therefore, to reduce the power consumption, the processing circuit 30 is usually powered by two power supplies, to maintain working of the processing circuit 30.

Based on the foregoing description, in this application, the processing circuit 30 may be powered by the first power supply, to control the data read/write operation, and may be powered by the second power supply, to store the data array. In addition, because the first power supply may be powered off as the system is powered off, and the second power supply may not be affected by a system power-down and may continuously supply the power, the processing circuit 30 may still store the data array. Functions of the memory 1 may be implemented by properly using the power supply, without adding a new power supply to the memory 1, and therefore this can avoid a waste of resources.

Figure 6:
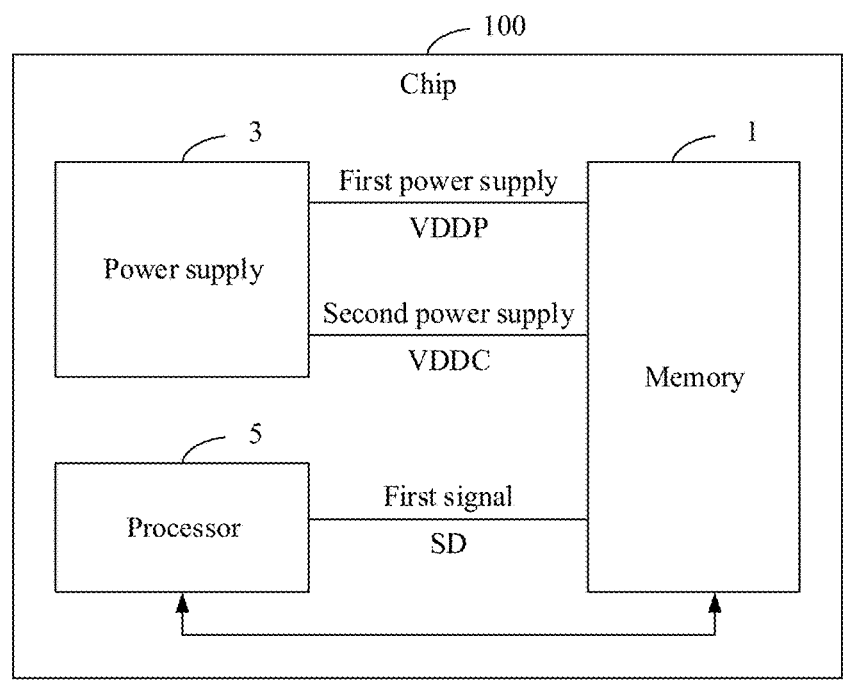
FIG. 6 is a schematic diagram of a structure of a chip according to an embodiment of this application.

For example, this application further provides a chip. FIG. 6 is a schematic diagram of a structure of a chip according to an embodiment of this application. As shown in FIG. 6, a chip 100 in this application may include a power supply 3, a processor 5, and a memory 1.

A specific implementation of the chip 100 is not limited in this application. The chip 100 may be integrated into various electronic devices such as a television, a mobile phone, a notebook computer, or a wearable device, or may be separately disposed. This is not limited in this application. In addition, the chip 100 may further communicate with an external device, for example, the chip may receive user instructions or transmit data.

In this application, the power supply 3 supplies power to the memory 1 through a first power supply and a second power supply, so that a repair circuit 10 in the memory 1 may continuously supply power for obtaining and maintaining repair information of the random access memory 1, to ensure that the memory 1 may store the repair information. In addition, a processing circuit 30 in the memory 1 may work normally due to the power supply 3.

A specific implementation of the power supply 3 is not limited in this application. For example, the power supply 3 may be a single power supply or a multi-power supply. The power supply 3 may be disposed in the chip 100, or may be externally inserted into the chip 100. A specific implementation of the power supply 3 is not limited in this application.

In this application, the processor 5 may send a first signal to the repair circuit 10 in the memory 1, so that the repair circuit 10 in the memory 1 may be powered by the first power supply or the second power supply based on a status of the first signal, to store the repair information of the memory 1. In addition, based on an electrical connection between the memory 1 and the processor 5 (shown by using a double-headed arrow in FIG. 5), the processing circuit 30 in the memory 1 may perform communication between the memory 1 and the processor 5 based on the repair information.

The processor 5 may include a component that may perform a data read/write operation in the memory 1, such as a GPU, a CPU, or a DSP. The memory 1 may be configured to execute technical solutions of embodiments shown in FIG. 2 to FIG. 5. Implementation principles and technical effects thereof are similar. Details are not described herein again.

In addition, the power supply 3 may further supply the power to the processor 5 (not shown in FIG. 6), to ensure that the processor 5 may work normally. The power supply 3 may further supply the power to another module in the chip 100 (not shown in FIG. 6). This is not limited in this application.

The chip provided in this application may be applied to execute technical solutions of the memory in the embodiments shown in FIG. 2 to FIG. 5. Implementation principles and technical effects thereof are similar. Details are not described herein again.

Figure 7:
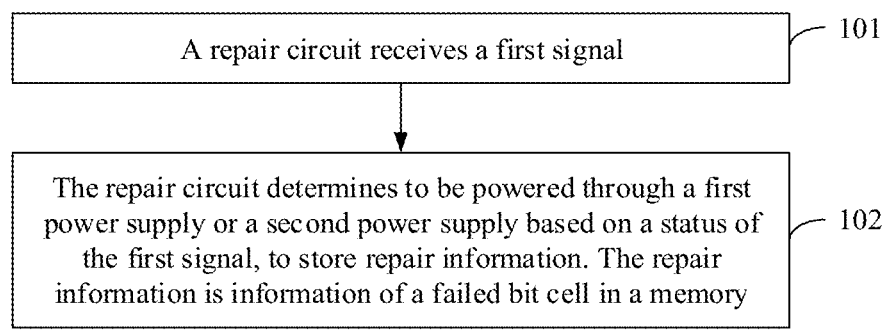
FIG. 7 is a flowchart of a method for storing repair information of a memory according to an embodiment of this application.

For example, this application further provides a method for storing repair information of a memory. FIG. 7 is a flowchart of a method for storing repair information of a memory according to an embodiment of this application. The method for storing repair information of a memory in this application may be applied to the memory shown in FIG. 2 to FIG. 6, and is configured to implement an operation corresponding to a repair circuit in any one of the foregoing embodiments. The memory includes a repair circuit and a processing circuit. The processing circuit may perform communication between the memory and a processor based on the repair information of the memory.

As shown in FIG. 7, the method for storing repair information of a memory provided in this application may include the following steps.

S101: The repair circuit receives a first signal from the processor.

S102: The repair circuit determines to be powered by a first power supply or a second power supply based on a status of the first signal, to store the repair information. The repair information is information of the failed bit cells in the memory.

In this application, the repair circuit is powered by the first power supply and the second power supply. In addition, the first power supply is zero or in a high impedance state as a system is powered off, to be specific, the first power supply may be powered off as the system is powered off. The second power supply is not zero when the system is powered off, to be specific, the second power supply is not affected and may continuously supply power as the system is powered off. Therefore, the repair circuit may be powered by the first power supply or the second power supply based on an indication of the status of the first signal, to store the repair information of the memory.

In this way, the repair circuit may switch, based on the indication of the status of the first signal, between the first power supply and the second power supply, so that the repair information of the memory may be continuously stored. This helps the processing circuit accurately obtain the repair information of the memory from the repair circuit in a timely manner, and determine the failed bit cells in the memory. Therefore, the efficiency and accuracy of a data read/write operation between the memory and the processor are improved. In addition, duration of reloading the repair information by the repair circuit is reduced, and even if the system is powered off, the chip may not occupy duration of the data read/write operation because of reloading of the repair information. Therefore, the chip may implement effective power-down, to successfully perform communication between the processor and the processor.

In some embodiments, that the repair circuit determines to be powered by a first power supply or a second power supply based on a status of the first signal, to store the repair information in the step S102 may include the following steps.

When the status of the first signal is a first state, the repair circuit may store the repair information using the first power supply. Alternatively, when the status of the first signal is a second state, the repair circuit may store the repair information using the second power supply. The second state is different from the first state.

In some embodiments, the method may further include: when the status of the first signal is the first state, the repair circuit determines that the first power supply is in a working state, to be specific, the first power supply is currently not powered off. When the status of the first signal is the second state, the repair circuit may determine that the first power supply is powered off, to be specific, the first power supply may currently not be powered off. Alternatively, the repair circuit may determine to stop storing the repair information using the first power supply, to be specific, the first power supply currently does not need to supply the power to the repair circuit.

In some embodiments, the first state is a low level state, and the second state is a high level state. Alternatively, the first state is a high level state, and the second state is a low level state.

In some embodiments, the repair information is information pre-stored in the repair circuit.

The method for storing repair information of a memory provided in this application may be applied to technical solutions of the memory in the embodiments in FIG. 2 to FIG. 6. Implementation principles and technical effects thereof are similar. Details are not described herein again.

What is claimed is:

1. A memory, comprising:
a repair circuit, configured to receive a first signal from a processor and determine to be powered by a first power supply or a second power supply based on a status of the first signal, to store repair information, wherein the repair information is information of a failed bit cell in the memory, the first power supply is zero or in a high impedance state when a system is powered off, and the second power supply is not zero when the system is powered off; and
a processing circuit, configured to perform communication between the memory and the processor based on the repair information.

2. The memory according to claim 1, wherein
the repair circuit is configured to: when the status of the first signal is a first state, store the repair information using the first power supply; and when the status of the first signal is a second state, store the repair information using the second power supply, wherein the second state is different from the first state.

3. The memory according to claim 2, wherein
the first state is a low level state, and the second state is a high level state; or
the first state is a high level state, and the second state is a low level state.

4. The memory according to claim 1, wherein the repair circuit comprises: a first circuit and a second circuit that are electrically connected; the second circuit is further electrically connected to the processing circuit; and
the first circuit is configured to: receive first information from the processor, and control, based on the status of the first signal, the second circuit to be powered by the first power supply or the second power supply, to store the repair information.

5. The memory according to claim 4, wherein the first circuit comprises: M phase inverters, a first PMOS transistor, a first NMOS transistor, a second PMOS transistor, a third PMOS transistor, and a second NMOS transistor; and
wherein M is a positive integer, and the M phase inverters are connected in series; one end of the M phase inverters connected in series is configured to receive the first signal, and the other end of the M phase inverters connected in series is electrically connected to a gate of the first PMOS transistor and a gate of the first NMOS transistor; a power terminal of each phase inverter and a source of the first PMOS transistor are configured to receive the second power supply; the source of the first PMOS transistor is electrically connected to a substrate electrode; a drain of the first PMOS transistor, a drain of the first NMOS transistor, a gate and a drain of the second NMOS transistor, a gate of the second PMOS transistor, and a gate of the third PMOS transistor are electrically connected; a source of the first NMOS transistor is electrically connected to the substrate electrode; a source of the second PMOS transistor is configured to receive the first power supply; the source of the second PMOS transistor is electrically connected to the substrate electrode, a drain of the second PMOS transistor is electrically connected to a source of the third PMOS transistor, the source of the third PMOS transistor is electrically connected to the substrate electrode, and a drain of the third PMOS transistor and a source of the second NMOS transistor are electrically connected to the second circuit; a ground terminal of each phase inverter, the source of the first NMOS transistor, and a substrate electrode of the second NMOS transistor are all grounded; and a voltage value of the first power supply is less than that of the second power supply.

6. The memory according to claim 4, wherein
the first circuit is configured to: when the status of the first signal is the first state, control the second circuit to store the repair information using the first power supply;
the first circuit is further configured to: when the status of the first signal is the second state, control the second circuit to store the repair information using the second power supply; and
the second state is different from the first state.

7. The memory according to claim 5, wherein
when the first state is the low level state and the second state is the high level state, M is an odd number; or
when the first state is the high level state and the second state is the low level state, M is an even number.

8. The memory according to claim 7, wherein a size of an $m^{th}$ phase inverter is less than that of an $(m+1)^{th}$ phase inverter, m is any integer greater than or equal to 1 and less than M.

9. The memory according to claim 4, wherein the second circuit is configured to pre-store the repair information.

10. The memory according to claim 4, wherein the second circuit comprises N D flip-flops or N JK flip-flops, and N is a positive integer.

11. The memory according to claim 4, wherein
the processing circuit is powered by the first power supply and the second power supply.

12. A chip, comprising: a power supply, a processor, and the memory according to claim 1, wherein
the power supply supplies power to the memory through the first power supply and the second power supply; the processor sends the first signal to the memory; and communicates with the memory based on the repair information of the memory.

13. A method for storing repair information of a memory, applied to the memory, wherein the memory comprises a repair circuit and a processing circuit; and the processing circuit is configured to perform communication between the memory and a processor based on the repair information;
the method comprises:
receiving, by the repair circuit, a first signal from the processor; and
determining, by the repair circuit, to be powered by a first power supply or a second power supply based on a status of the first signal, to store the repair information, wherein the repair information is information of a failed bit cell in the memory, the first power supply is zero or in a high impedance state when a system is powered off, and the second power supply is not zero when the system is powered off.

14. The method according to claim 13, wherein the determining, by the repair circuit, to be powered by a first power supply or a second power supply based on a status of the first signal, to store the repair information comprises:
when the status of the first signal is a first state, storing, by the repair circuit, the repair information using the first power supply; or
when the status of the first signal is a second state, storing, by the repair circuit, the repair information using the second power supply; and
the second state is different from the first state.

15. The method according to claim 14, wherein
the first state is a low level state, and the second state is a high level state; or
the first state is a high level state, and the second state is a low level state.

16. The method according to claim 13, wherein
the repair information is information pre-stored in the repair circuit.

* * * * *